US009780119B2

(12) United States Patent
Shangguan et al.

(10) Patent No.: US 9,780,119 B2
(45) Date of Patent: Oct. 3, 2017

(54) PACKAGE COVER PLATE FOR PACKAGING A CURVED DISPLAY PANEL HAVING AT LEAST TWO CURVED PORTIONS, DISPLAY PANEL AND DISPLAY DEVICE HAVING THE SAME

(71) Applicant: BOE TECHNOLOGY GROUP CO., LTD., Beijing (CN)

(72) Inventors: Ronggang Shangguan, Beijing (CN); Li Sun, Beijing (CN)

(73) Assignee: BOE TECHNOLOGY GROUP CO., LTD., Chaoyang District, Beijing (CN)

( * ) Notice: Subject to any disclaimer, the term of this patent is extended or adjusted under 35 U.S.C. 154(b) by 0 days.

(21) Appl. No.: 15/030,602

(22) PCT Filed: Dec. 10, 2015

(86) PCT No.: PCT/CN2015/096901
§ 371 (c)(1),
(2) Date: Apr. 20, 2016

(87) PCT Pub. No.: WO2016/188084
PCT Pub. Date: Dec. 1, 2016

(65) Prior Publication Data
US 2016/0351594 A1 Dec. 1, 2016

(30) Foreign Application Priority Data
May 27, 2015 (CN) .......................... 2015 1 0278088

(51) Int. Cl.
H01L 27/12 (2006.01)
H01L 33/54 (2010.01)

(52) U.S. Cl.
CPC .......... *H01L 27/1218* (2013.01); *H01L 33/54* (2013.01)

(58) Field of Classification Search
CPC ... H01L 27/1214; H01L 51/52; H01L 51/524; H01L 51/56; H01L 27/1218; H01L 33/54
See application file for complete search history.

(56) References Cited

U.S. PATENT DOCUMENTS

2015/0165720 A1* 6/2015 Lim .......................... B32B 1/00
428/174

FOREIGN PATENT DOCUMENTS

| CN | 102445774 A | 5/2012 |
| CN | 103903515 A | 7/2014 |
| CN | 104600208 A | 5/2015 |
| CN | 104851364 A | 8/2015 |
| JP | 2012078825 A | 4/2012 |

OTHER PUBLICATIONS

International Search Report & Written Opinion dated Mar. 4, 2016 regarding PCT/CN2015/096901.

* cited by examiner

*Primary Examiner* — Benjamin Sandvik
*Assistant Examiner* — Damon Hillman
(74) *Attorney, Agent, or Firm* — Intellectual Valley Law, P.C.

(57) ABSTRACT

The present application discloses a package cover plate for packaging a curved display panel comprising at least two curved portions.

20 Claims, 6 Drawing Sheets

PACKAGE COVER PLATE FOR PACKAGING A CURVED DISPLAY PANEL HAVING AT LEAST TWO CURVED PORTIONS, DISPLAY PANEL AND DISPLAY DEVICE HAVING THE SAME

CROSS-REFERENCE TO RELATED APPLICATION

This application is a national stage application under 35 U.S.C. §371 of International Application No. PCT/CN2015/096901 filed Dec. 10, 2015, which claims priority to Chinese Patent Application No. 201510278088.8, filed May 27, 2015, the contents of which are incorporated by reference in the entirety.

FIELD

The present invention relates to display technology, more particularly, to a package cover plate, and a display panel and a display device having the same.

BACKGROUND

Convention display devices are usually flat. In recent years, display devices having a curved display surface have been proposed for design or other reasons. Applications of curved display devices are increasing, including computer monitors, televisions, and personal portable devices.

SUMMARY

In one aspect, the present invention provides a package cover plate for packaging a curved display panel comprising at least two curved portions.

Optionally, the package cover plate is curved in a first direction with the curved portions arranged along the first direction.

Optionally, the package cover plate comprises more than two curved portions each of which having a span along the first direction, the spans of the curved portions in a peripheral region of the package cover plate is equal to or less than the spans of the curved portions in a central region of the package cover plate.

Optionally, the spans of the curved portions gradually decrease from the central region to the peripheral region of the package cover plate.

Optionally, the curved portions in the peripheral region are symmetrically arranged about a midline of the package cover plate.

Optionally, the span of a curved portion disposed in the center of the package cover plate is less than half of a span of the package cover plate.

Optionally, the package cover plate comprises more than two curved portions each of which having an area, the area of each curved portion in the peripheral region of the package cover plate is equal to or less than the area of each curved portion in the central region of the package cover plate.

Optionally, the areas of the curved portions gradually decrease from the central region to the peripheral region of the package cover plate.

Optionally, the package cover plate comprises more than two curved portions each of which having a curvature, the curvature of the curved portions in the peripheral region of the package cover plate is larger than the curvature of the curved portions in the central region of the package cover plate.

Optionally, the curvature of the curved portions gradually increase from the central region to the peripheral region of the package cover plate.

Optionally, the curvature of each of the curved portions is larger than a curvature of the package cover plate when the package cover plate is packaged in a curved display panel.

Optionally, the curved portion has an arc shape.

Optionally, the curved portion has a partial cylinder shape, and the length of the curved portion substantially equals to the width of the package cover plate.

Optionally, the curved portion has a partial cylinder shape, and the length of the curved portion is less than the width of the package cover plate.

Optionally, the package cover plate comprises at least one group of curved portions comprising a plurality of the curved portions and at least one flat portions.

Optionally, the flat portions and the group of curved portions are alternately disposed on the package cover plate along a direction perpendicular to the first direction.

Optionally, the package cover plate comprises one group of curved portions sandwiched by two flat portions along the direction perpendicular to the first direction.

Optionally, the package cover plate comprises one flat portion sandwiched by two groups of curved portions along the direction perpendicular to the first direction.

Optionally, the package cover plate comprises glass, metal or acrylic.

In another aspect, the present invention provides a display panel comprising the package cover plate described herein.

Optionally, the display panel further comprising a display substrate comprising an array substrate and an electroluminescent device layer disposed on the array substrate.

Optionally, the electroluminescent device layer is disposed on a side of the array substrate proximal to the package cover plate, and the display substrate is secured to the package cover plate.

Optionally, the electroluminescent device layer comprises an electroluminescent material layer and a cathode, the electroluminescent material layer is disposed on a side of the electroluminescent device layer proximal to the array substrate, the cathode is disposed on a side of the electroluminescent device layer distal to the array substrate, the array substrate comprises an anode disposed on a side of the array substrate proximal to the electroluminescent device layer.

Optionally, the display substrate is secured to the package cover plate through an encapsulating film.

Optionally, a space between the package cover plate and the display substrate is completely filled with the encapsulating film.

Optionally, a space between the package cover plate and the display substrate is partly filled with the encapsulating film on a side proximal to the display substrate, and partly filled with insert gas on a side proximal to the package cover plate.

Optionally, a space between the package cover plate and the display substrate is partly filled with the encapsulating film on a side proximal to the display substrate, and partly vacuum on a side proximal to the package cover plate.

In another aspect, the present invention provides a display device comprising a curved display panel described herein.

Optionally, the package cover plate is curved in a first direction, the curved portions are arranged along the first direction, and the curved portion protrudes toward a convex side of the package cover.

BRIEF DESCRIPTION OF THE FIGURES

The following drawings are merely examples for illustrative purposes according to various disclosed embodiments and are not intended to limit the scope of the present invention.

DETAILED DESCRIPTION OF THE EMBODIMENTS

The disclosure will now describe more specifically with reference to the following embodiments. It is to be noted that the following descriptions of some embodiments are presented herein for purpose of illustration and description only. It is not intended to be exhaustive or to be limited to the precise form disclosed.

Figure 1:
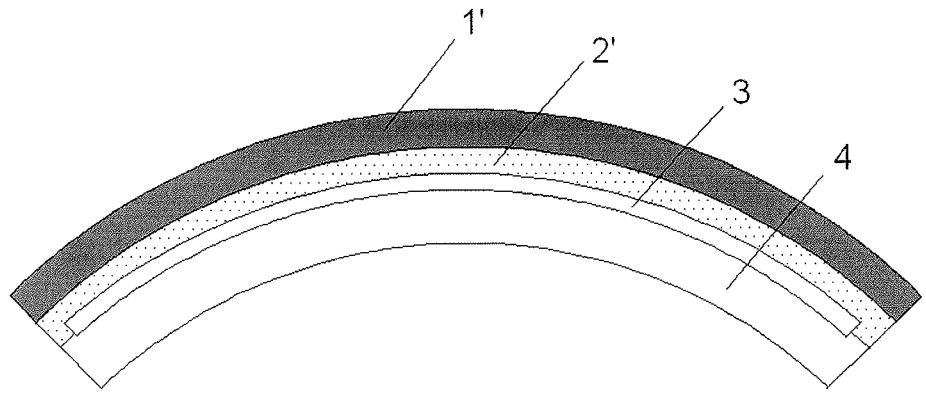
FIG. 1 is a diagram illustrating the structure of a conventional curved display panel.

FIG. 1 shows the structure of a curved display panel. In FIG. 1, the display substrate is secured to the package cover plate 1' through an encapsulating film 2'. The display substrate includes an array substrate 4 and an electroluminescent device layer 3 disposed on the array substrate 4. The display substrate is bent when assembled together with package cover plate 1'.

Figure 2:
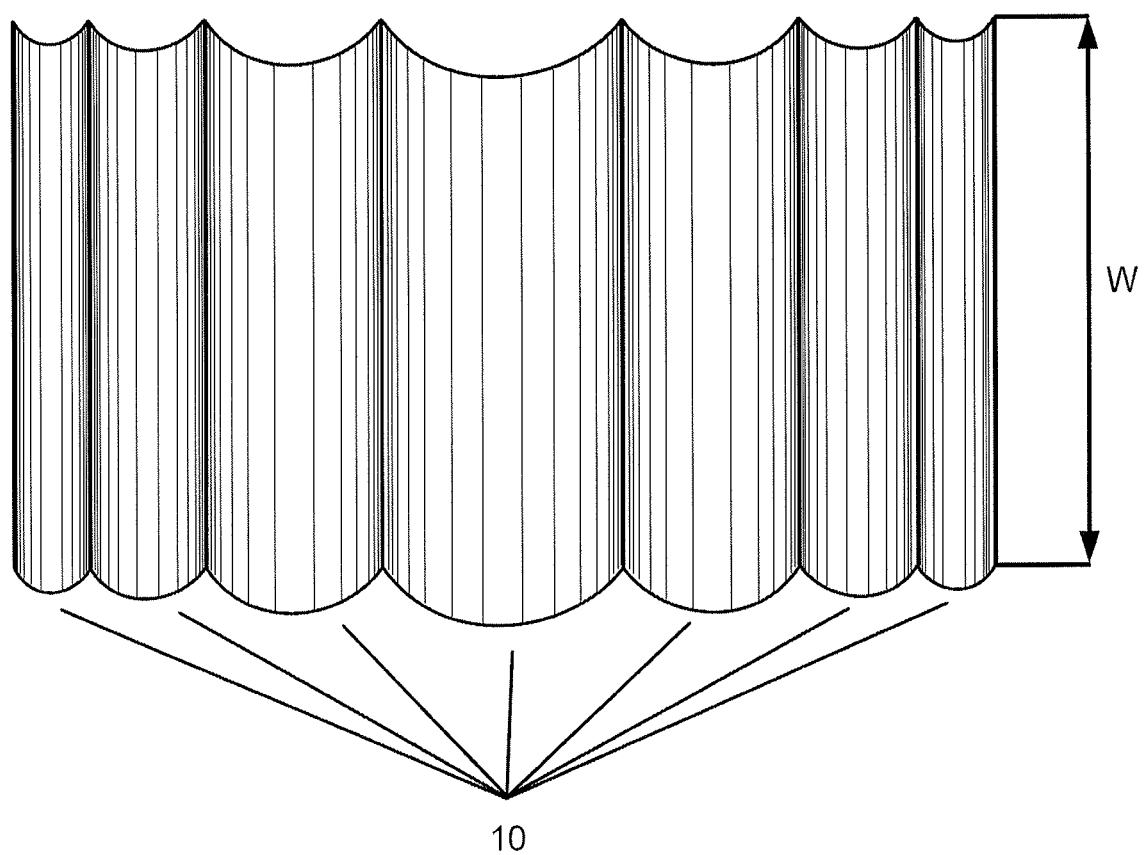
FIG. 2 is a diagram illustrating the structure of a package cover plate in rear view in an embodiment.
Figure 3:
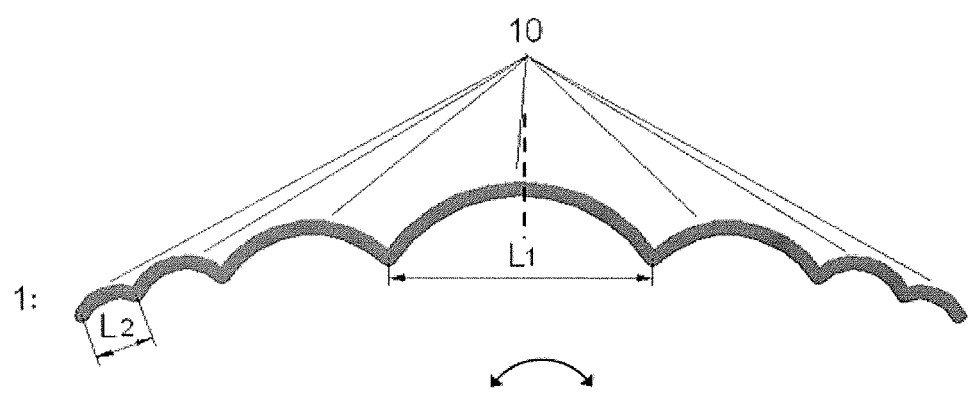
FIG. 3 is a diagram illustrating the structure of a package cover plate in plan view in an embodiment.

FIG. 2 is a diagram illustrating the structure of a package cover plate 1 in rear view in an embodiment. FIG. 3 is a diagram illustrating the structure of a package cover plate 1 in plan view in an embodiment. Referring to FIGS. 2 and 3, the package cover plate 1 in the embodiment includes at least two curved portions 10 arranged along a first direction of the package cover plate 1 (e.g., a curvature direction of the package cover plate 1, i.e., the direction along the curvature of the package cover plate 1). As shown in FIG. 3, the curved portions 10 protrude towards a convex side of the package cover plate, i.e., the convex side of each of the curved portions 10 is on a same side as the convex side of the package cover plate 1, and the concave side of the curved portions 10 is on a same side as the concave side of the package cover plate 1. Optionally, the convex side and the first direction of the package cover plate 1 are a convex side and a first direction before the package cover plate is assembled in the curved display panel. Optionally, the convex side and the curvature direction of the package cover plate 1 are a convex side and a curvature direction when the package cover plate is assembled in the curved display panel.

Various design options can be used for the curved portion 10. The curved portion 10 may be designed to have a certain curvature and a certain curved shape. Optionally, the curvature of each curved portion 10 is larger than the overall curvature of the package cover plate 1. Optionally, the curved portion 10 has a partial cylinder shape. Optionally, the curved portion 10 has a cross-section having an arc shape. Optionally, the package cover plate 1 includes more than 2, 3, 4, 5, 6, 7, 8, 9, 10, 15, 20, 25, or 30 curved portions 10.

Figure 4:
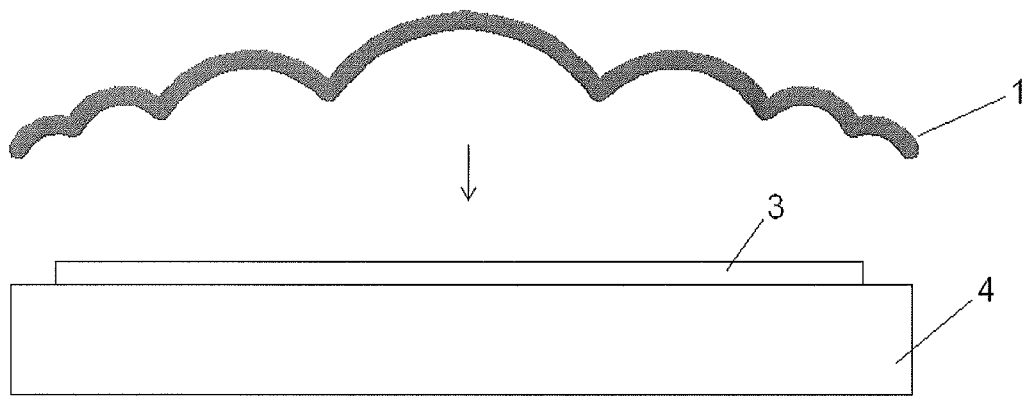
FIG. 4 is a diagram illustrating in plan view the assembly of a display substrate with a package cover plate in an embodiment.

FIG. 4 is a diagram illustrating in plan view the assembly of a curved display panel in an embodiment. Referring to FIG. 4, the curved display panel in the embodiment is assembled by a package cover plate 1 and a display substrate. The display substrate includes an array substrate 4 and an electroluminescent device layer 3. In an assembling process, optionally, the display substrate can be first secured to the package cover plate 1 to form an assembled display panel, followed by bending the assembled display panel to obtain a curved display panel. Alternatively, the package cover plate 1 and the display substrate may be first bent separately. The bent package cover plate 1 and display substrate are then assembled together, e.g., using an encapsulating film 2.

The package cover plate 1 having curved portions 10 can effectively reduce resilience within an assembled, curved display panel. In the assembled, curved display panel, the inward tension produced by the structure of the curved portions 10 alleviates the tensile stress placed on the encapsulating film 2. The design prevents or reduces stress crack in the encapsulating film 2, thereby stabilize the curved display panel.

In some embodiments, the package cover plate 1 includes more than two curved portions 10, each of which having a span along the first direction (e.g., the curvature direction) of the package cover plate 1. As used herein, the term span refers to the distance between two end points of a curved portion 10 in a cross-section along the first direction of the package cover plate 1. Optionally, the spans of the curved portions 10 in a peripheral region of the package cover plate 1 is equal to or less than the spans of the curved portions 10 in a central region of the package cover plate 1. For example, as shown in FIG. 3, L1>L2. This design enhances the stability and durability of an assembled, curved display panel.

Optionally, the spans of the curved portions 10 gradually decrease from the central region to the peripheral region of the package cover plate 1. This design effectively reduces resilience within an assembled, curved display panel.

Optionally, the curved portions 10 in the peripheral region are symmetrically arranged about a midline of the package cover plate 1, e.g., a midline which is perpendicular to the first direction (e.g., the curvature direction) of the package cover plate 1. This design enhances the stability of the package cover plate 1, and the stability and durability of the curved display panel. Optionally, the package cover plate 1 has an odd number of curved portions 10, with a central curved portion arranged on the midline of the package cover plate 1. All other curved portions 10 are symmetrically arranged about the central curved portion 10 (FIG. 3). Optionally, the span of the central curved portion 10 is less than half of the total span of the package cover plate 1. Optionally, the package cover plate 1 includes an even number of curved portion 10. All curved portions 10 in the peripheral region are symmetrically arranged about the midline of the package cover plate 1. Optionally, the span of each of two curved portions 10 next to the midline is less than half of the total span of the package cover plate 1. Optionally, the total span of two curved portions 10 next to the midline is less than half of the total span of the package cover plate 1.

As shown in FIG. 3, the package cover plate 1 in the embodiment includes seven curved portions 10. The spans of the curved portions 10 gradually decrease from the central region to the peripheral region of the package cover plate 1. The curved portions 10 in the peripheral region are symmetrically arranged about the central curved portion 10. The span of the central curved portion 10 is less than half of the total span of the package cover plate 1. The package cover plate 1 in the embodiment is more flexible than a conventional package cover plate.

In some embodiments, the package cover plate 1 includes more than two curved portions 10, each of which having an area. Optionally, the area of each curved portions 10 in the peripheral region of the package cover plate 1 is equal to or less than the area of each curved portion 10 in the central region of the package cover plate 1. Optionally, the areas of the curved portions gradually decrease from the central region to the peripheral region of the package cover plate. These design options can effectively reduce resilience within an assembled, curved display panel, and enhances the stability and durability of the curved display panel.

In some embodiments, the package cover plate includes more than two curved portions, each of which having a curvature. Optionally, the curvature of each curved portion 10 in the peripheral region of the package cover plate 1 is larger than the curvature of each curved portion 10 in the central region of the package cover plate 1. Optionally, the curvature of the curved portions gradually increase from the central region to the peripheral region of the package cover plate. These design options effectively reduce resilience of the assembled, curved display panel, and enhances its flexibility. In an assembled, curved display panel, the strong inward tension produced by the structure of the curved portions 10 alleviates the tensile stress placed on the encapsulating film 2. The structure prevents or reduces stress crack in the encapsulating film 2, thereby enhances stability and durability in an assembled, curved display panel.

The package cover plate 1 as discussed herein can be bent for making a curved display panel. Optionally, when the package cover plate 1 is bent and assembled in a curved display panel, the curvature of each curved portion 10 is larger than the overall curvature of the package cover plate 1. Optionally, the curved portion 10 has a partial cylinder shape, i.e., the cross-section of the curved portion 10 is an arc.

Figure 5:
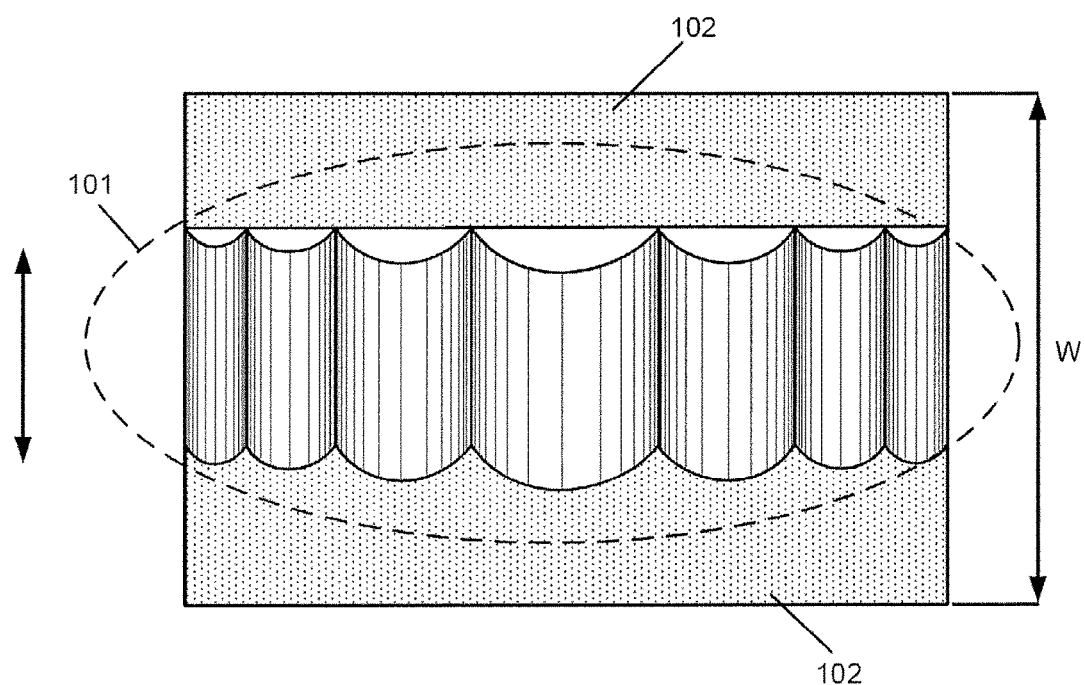
FIG. 5 is a diagram illustrating the structure of a package cover plate in rear view in another embodiment.
Figure 6:
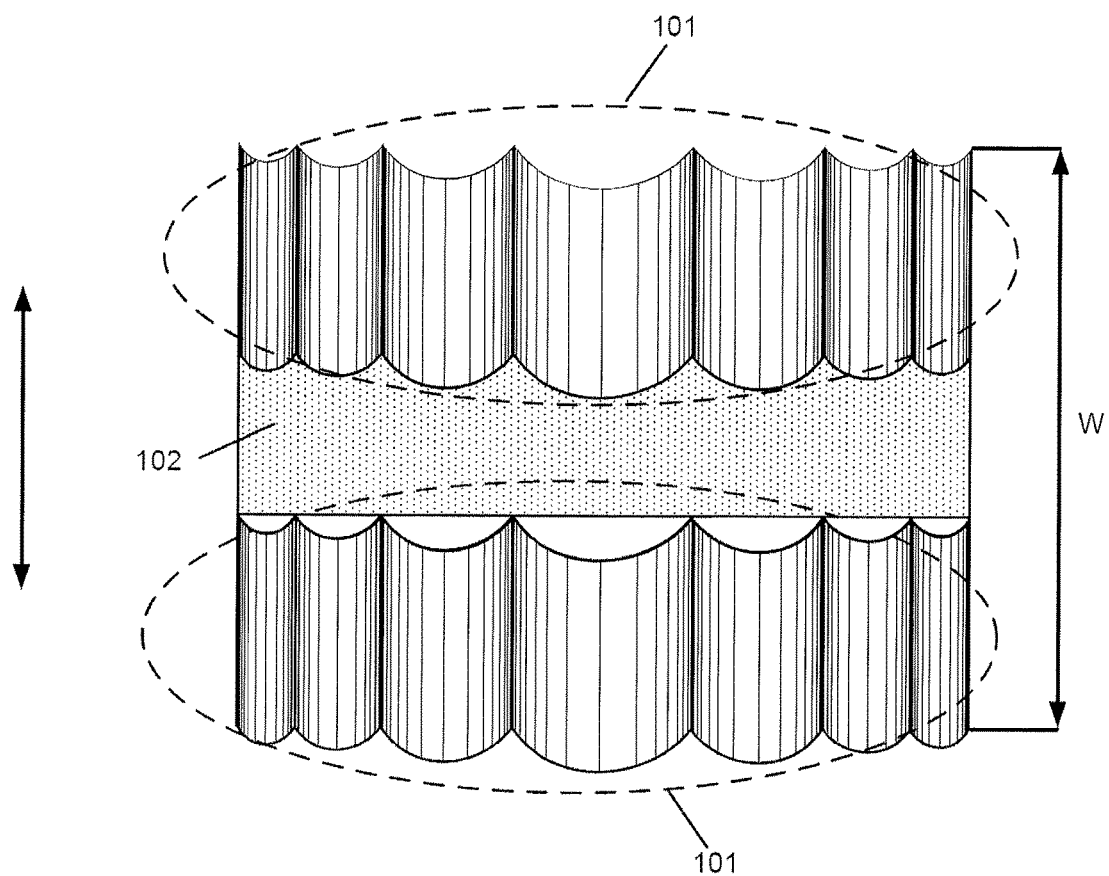
FIG. 6 is a diagram illustrating the structure of a package cover plate in rear view in another embodiment.

Optionally, the length of the curved portion 10 (i.e., the side perpendicular to the curved portion 10's curvature direction) substantially equals to the width of the package cover plate 1 (i.e., the side perpendicular to the curvature direction of the package cover plate 1) (FIG. 2). For example, the surface of the package cover plate 1 is substantially completely occupied by the curved portions 10. Optionally, the length of the curved portion 10 is less than the width of the package cover plate 1. Optionally, the package cover plate 1 includes at least one flat portions 102 and at least one group of curved portions having a plurality of the curved portions 10. The flat portions 102 and the group of curved portions are alternately disposed on the package cover plate 1 along a direction perpendicular to the curvature direction of the package cover plate 1, i.e., along the width of the package cover plate 1 (as indicated by the arrows in FIGS. 5 and 6). This design can selectively enhance stability and durability in a certain portion of the package cover plate 1. Optionally, the package cover plate 1 includes one group of curved portions sandwiched by two flat portions 102 along the direction perpendicular to the width direction of the package cover plate 1 (FIG. 5), selectively reducing resilience in the middle region of the package cover plate 1. Optionally, the package cover plate 1 includes one flat portion 102 sandwiched by two groups of curved portions along the direction perpendicular to the width direction of the package cover plate 1 (FIG. 6), selectively reducing resilience in the upper and lower regions of the package cover plate 1. Other combinations and arrangements of flat portions 102 and groups of curved portions 10 can be used based on the design needs. The package cover plate can be made of any suitable materials, e.g., glass, metal or acrylic.

Optionally, the total span of the curved portions 10 substantially equals to the total span of the package cover plate 1. Optionally, the total span of the curved portion 10 is less than the total span of the package cover plate 1. Optionally, the package cover plate 1 includes at least one flat portions in the peripheral regions of the package cover plate 1.

Based on the above, the package cover plate 1 as described herein can be packaged in a curved display panel. The curved display panel having the package cover plate 1 has reduced resilience and enhanced flexibility, stability and durability. The package cover plate 1 can be used in a variety of display devices, include liquid crystal display devices and organic light emitting display devices.

Figure 7:
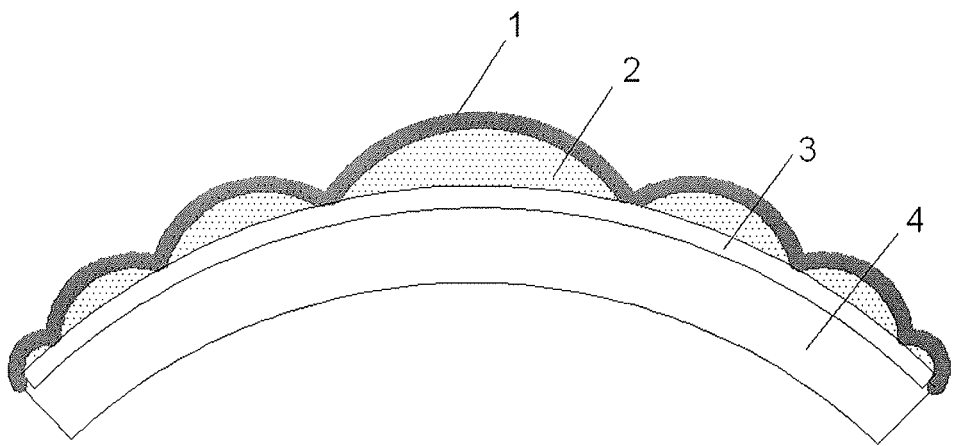
FIG. 7 is a diagram illustrating the structure of an assembled curved display panel in plan view in an embodiment.

FIG. 7 is a diagram illustrating the structure of an assembled curved display panel in plan view in an embodiment. Referring to FIG. 7, the curved display panel in the embodiment includes a package cover plate 1 and a display substrate. The display substrate in the embodiment includes an array substrate 4 and an electroluminescent device layer 3 disposed on the array substrate 4. The electroluminescent device layer 3 is disposed on a side of the array substrate 4 layer proximal to the package cover plate 1 (e.g., proximal to the convex side of the package cover plate 1). The display substrate can be secured to the package cover plate 1 through an encapsulating film 2, e.g., by a face seal material. The package cover plate 1 having curved portions 10 can effectively reduce resilience within an assembled, curved display panel. In the assembled, curved display panel, the inward tension produced by the structure of the curved portions 10 alleviates the tensile stress placed on the encapsulating film 2. The design prevents or reduces stress crack in the encapsulating film 2, thereby stabilize the curved display panel.

Optionally, the electroluminescent device layer 3 includes an electroluminescent material layer and a cathode. Optionally, the electroluminescent material layer is disposed on a side of the electroluminescent device layer 3 proximal to the array substrate 4. Optionally, the cathode is disposed on a side of the electroluminescent device layer 3 distal to the array substrate 4. Optionally, the array substrate 4 includes an anode disposed on a side of the array substrate 4 layer proximal to the electroluminescent device layer 3. Light emits from the concave side of the curved display panel. Optionally, the electroluminescent device layer 3 further includes an electron injection layer and an electron transport layer between the electroluminescent material layer and the cathode. Optionally, the electroluminescent device layer 3 further includes a hole injection layer and a hole transport layer between the electroluminescent material layer and the anode.

Figure 9:
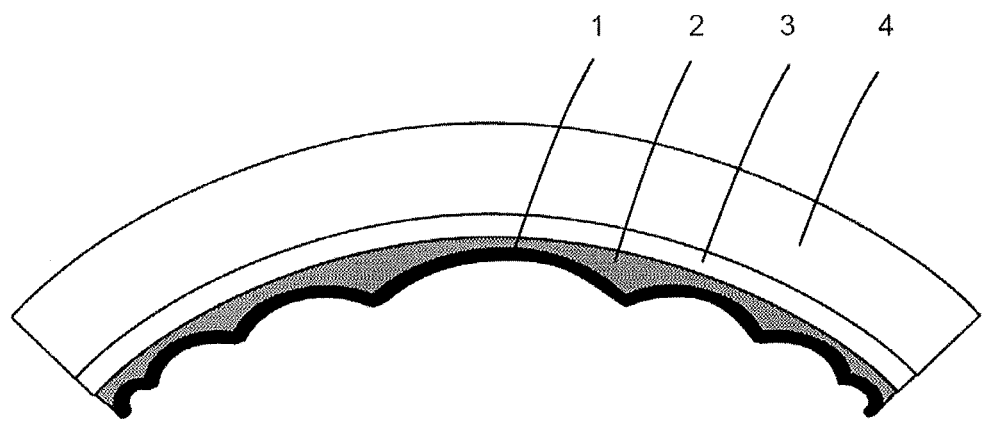
FIG. 9 is a diagram illustrating the structure of an assembled curved display panel in plan view in another embodiment.

FIG. 9 is a diagram illustrating the structure of an assembled curved display panel in plan view in another embodiment. Referring to FIG. 9, the curved display panel in the embodiment includes a package cover plate 1 and a display substrate. The display substrate in the embodiment includes an array substrate 4 and an electroluminescent device layer 3 disposed on the array substrate 4. The electroluminescent device layer 3 is disposed on a side of the array substrate 4 layer proximal to the package cover plate 1 (e.g., proximal to the convex side of the package cover plate 1). The display substrate can be secured to the package cover plate 1 through an encapsulating film 2, e.g., by a face seal material. The package cover plate 1 having curved portions 10 can effectively reduce resilience within an assembled, curved display panel. In the assembled, curved display panel, the inward tension produced by the structure of the curved portions 10 alleviates the tensile stress placed on the encapsulating film 2. The design prevents or reduces stress crack in the encapsulating film 2, thereby stabilize the curved display panel.

Optionally, the electroluminescent device layer 3 includes an electroluminescent material layer and a cathode. Optionally, the electroluminescent material layer is disposed on a side of the electroluminescent device layer 3 proximal to the array substrate 4. Optionally, the cathode is disposed on a side of the electroluminescent device layer 3 distal to the array substrate 4. Optionally, the array substrate 4 includes an anode disposed on a side of the array substrate 4 layer proximal to the electroluminescent device layer 3. Light emits from the convex side of the curved display panel. Optionally, the electroluminescent device layer 3 further includes an electron injection layer and an electron transport layer between the electroluminescent material layer and the cathode. Optionally, the electroluminescent device layer 3 further includes a hole injection layer and a hole transport layer between the electroluminescent material layer and the anode.

In some embodiments, the space between the package cover plate 1 and the display substrate is substantially completely filled with the encapsulating film 2. For example, as shown in FIGS. 7 and 9, the encapsulating film 2 fills the space between the electroluminescent device layer 3 and the package cover plate 1. This design enhances the stability of the curved display panel.

Figure 8:
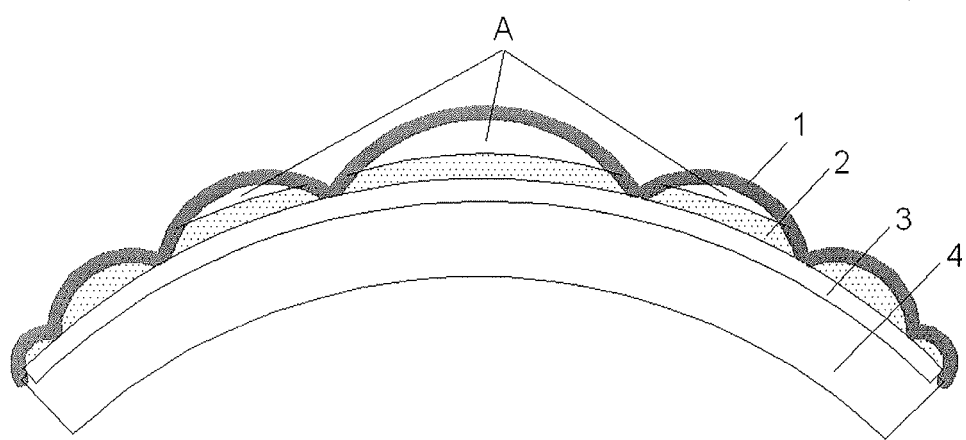
FIG. 8 is a diagram illustrating the structure of an assembled curved display panel in plan view in another embodiment.
Figure 10:
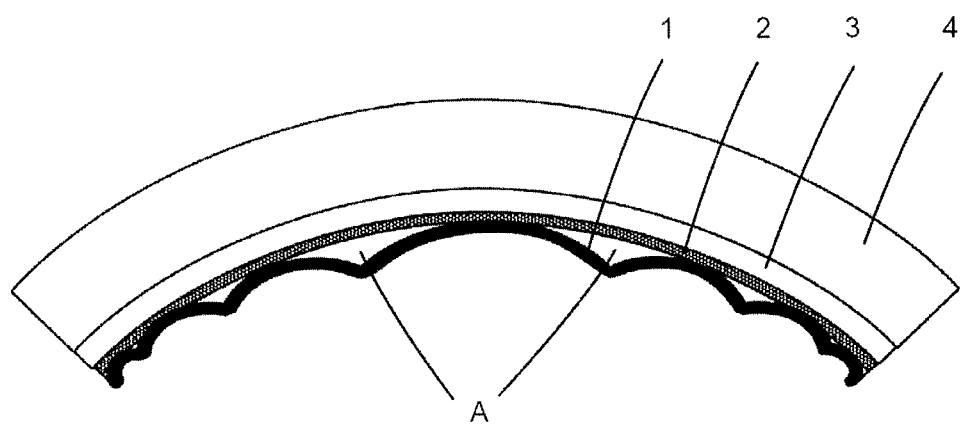
FIG. 10 is a diagram illustrating the structure of an assembled curved display panel in plan view in another embodiment.

In some embodiments, the space is partly filled with the encapsulating film 2 on a side proximal to the display substrate, and partly filled with insert gas on a side proximal to the package cover plate 1 (as indicated by "A" in FIGS. 8 and 10). In some embodiments, the space is partly filled with the encapsulating film 2 on a side proximal to the display substrate, and partly vacuum on a side proximal to the package cover plate 1 (as indicated by "A" in FIGS. 8 and 10). These designs provide a light weight display panel.

The present disclosure also provide a display device comprising the curved display panel as described herein. The display device has enhanced stability and durability.

The foregoing description of the embodiments of the invention has been presented for purposes of illustration and description. It is not intended to be exhaustive or to limit the invention to the precise form or to exemplary embodiments disclosed. Accordingly, the foregoing description should be regarded as illustrative rather than restrictive. Obviously, many modifications and variations will be apparent to practitioners skilled in this art. The embodiments are chosen and described in order to best explain the principles of the invention and its best mode practical application, thereby to enable persons skilled in the art to understand the invention for various embodiments and with various modifications as are suited to the particular use or implementation contemplated. It is intended that the scope of the invention be defined by the claims appended hereto and their equivalents in which all terms are meant in their broadest reasonable sense unless otherwise indicated. Therefore, the term "the invention", "the present invention" or the like does not necessarily limit the claim scope to a specific embodiment, and the reference to exemplary embodiments of the invention does not imply a limitation on the invention, and no such limitation is to be inferred. The invention is limited only by the spirit and scope of the appended claims. Moreover, these claims may refer to use "first", "second", etc. following with noun or element. Such terms should be understood as a nomenclature and should not be construed as giving the limitation on the number of the elements modified by such nomenclature unless specific number has been given. Any advantages and benefits described may not apply to all embodiments of the invention. It should be appreciated that variations may be made in the embodiments described by persons skilled in the art without departing from the scope of the present invention as defined by the following claims. Moreover, no element and component in the present disclosure is intended to be dedicated to the public regardless of whether the element or component is explicitly recited in the following claims.

What is claimed is:

1. A package cover plate for packaging a curved display panel, comprising at least two curved portions arranged along a first direction, wherein the package cover plate is curved along the first direction, and each of the at least two curved portions protrudes toward a convex side of the package cover.

2. The package cover plate of claim 1, wherein the package cover plate comprises more than two curved portions each of which having a span along the first direction, spans of curved portions in a peripheral region of the package cover plate is equal to or less than the spans of curved portions in a central region of the package cover plate.

3. The package cover plate of claim 2, wherein the spans of the curved portions gradually decrease from the central region to the peripheral region of the package cover plate.

4. The package cover plate of claim 3, wherein the curved portions in the peripheral region are symmetrically arranged about a midline of the package cover plate.

5. The package cover plate of claim 4, wherein the span of a curved portion disposed in the center of the package cover plate is less than half of a span of the package cover plate.

6. A package cover plate for packaging a curved display panel, comprising at least two curved portions arranged along a first direction; wherein each of the at least two curved portions protrudes toward a same side of the package cover; the package cover plate comprises more than two curved portions each of which having an area, an area of each curved portion in a peripheral region of the package cover plate is equal to or less than an area of each curved portion in a central region of the package cover plate.

7. The package cover plate of claim 6, wherein areas of the curved portions gradually decrease from the central region to the peripheral region of the package cover plate.

8. A package cover plate for packaging a curved display panel, comprising at least two curved portions arranged along a first direction; wherein each of the at least two curved portions protrudes toward a same side of the package cover; the package cover plate comprises more than two curved portions each of which having a curvature, curvatures of the curved portions in a peripheral region of the package cover plate is larger than curvatures of the curved portions in a central region of the package cover plate.

9. The package cover plate of claim 8, wherein curvatures of the curved portions gradually increase from the central region to the peripheral region of the package cover plate.

10. The package cover plate of claim 8, wherein the curvature of each of the curved portions is larger than a curvature of the package cover plate when the package cover plate is packaged in a curved display panel.

11. The package cover plate of claim 1, wherein each of the at least two curved portions has a partial cylinder shape, and a length of each of the at least two curved portions substantially equals to a width of the package cover plate.

12. The package cover plate of claim 1, wherein each of the at least two curved portions has a partial cylinder shape, and a length of each of the at least two curved portions is less than a width of the package cover plate;

the package cover plate comprises at least one group of curved portions comprising a plurality of curved portions, and at least one flat portions;

the at least one flat portions and the at least one group of curved portions are alternately disposed on the package cover plate along a direction perpendicular to the first direction.

13. The package cover plate of claim 12, wherein the package cover plate comprises one group of curved portions sandwiched by two flat portions along the direction perpendicular to the first direction.

14. The package cover plate of claim 12, wherein the package cover plate comprises one flat portion sandwiched by two groups of curved portions along the direction perpendicular to the first direction.

15. A display panel comprising the package cover plate of claim 1.

16. The display panel of claim 15, wherein the display panel further comprising a display substrate comprising an array substrate and an electroluminescent device layer disposed on the array substrate;

the electroluminescent device layer is disposed on a side of the array substrate proximal to the package cover plate, and the display substrate is secured to the package cover plate.

17. The display panel of claim 16, wherein the display substrate is secured to the package cover plate through an encapsulating film.

18. A display device comprising a display panel of claim 15.

19. The display device of claim 18, wherein the package cover plate is curved in a first direction, the at least two curved portions are arranged along the first direction, and each of the at least two curved portions protrude toward a convex side of the package cover.

20. The display panel of claim 17, wherein a space between the package cover plate and the display substrate is completely filled with the encapsulating film.

* * * * *